ми

United States Patent [19]
Schmidt

[11] Patent Number: 6,068,698
[45] Date of Patent: May 30, 2000

[54] P-TYPE SILICON MACROMOLECULE USED IN A TRANSISTOR AND PROCESS FOR MANUFACTURE OF THE MACROMOLECULE

[76] Inventor: Christian Schmidt, Salzstrasse 1a, D-85622 Feldkirchen, Germany

[21] Appl. No.: 09/005,278

[22] Filed: Jan. 9, 1998

[30] Foreign Application Priority Data

Oct. 2, 1997 [DE] Germany .......................... 197 43 755
Oct. 21, 1997 [DE] Germany .......................... 197 46 395

[51] Int. Cl.$^7$ .................................................. C30B 23/00
[52] U.S. Cl. ............................ 117/84; 117/105; 117/109; 423/324; 204/157.4; 204/157.45
[58] Field of Search ............................ 117/84, 109, 105; 423/324; 204/157.4, 157.45

[56] References Cited

U.S. PATENT DOCUMENTS

| 4,810,935 | 3/1989 | Boswell | .............................. 315/111.41 |
| 5,340,428 | 8/1994 | Kodokian | .............................. 156/272.2 |
| 5,900,063 | 5/1999 | Boswell et al. | .................... 118/723 VE |

OTHER PUBLICATIONS

Askeland, D.R., The Science and Engineering of Materials, 2nd Ed., PWS–Kent Co., Boston USA, inside front cover, 1989.

*Primary Examiner*—Benjamin L. Utech
*Assistant Examiner*—Matt Anderson
*Attorney, Agent, or Firm*—Collard & Roe, P.C.

[57] ABSTRACT

The invention relates to a p-type silicon macromolecule, with a multifaceted structure in which silicon atoms form the corners of an inner multifaceted structure having sides. Attached to each silicon atom is a doping atom. The doping atoms are attached to the silicon atoms and radiate out from the center of the molecule to form an outer multi-faceted structure having sides parallel to the inner multifaceted structure. The macromolecule forms a base facility in a transistor that comprises an emitter layer, a collector layer, connected to the base facility, and a control input structure. The control input structure comprises a dipole connected to a boundary surface on the transistor and at least one external modulation capacitor connected to the dipole. The capacitor receives a carrier signal from a control input signal. The dipole is spaced from the center a boundary surface by half a wavelength of the carrier signal. In this case, the charge carrier flows from the center of the affected surface on the emitter layer to the opposite parallel surface on the collector layer. The process includes the following steps: a) evaporation of a silicon crystal to produce a monatomic silicon vapor; b) generation of a rotating magnetic field enclosing the monatomic silicon vapor; c) injection of at least one doping material into the monatomic silicon vapor, and d) cooling of the monomolecular silicon-doping material vapor to a temperature below the crystallization temperature.

12 Claims, 5 Drawing Sheets

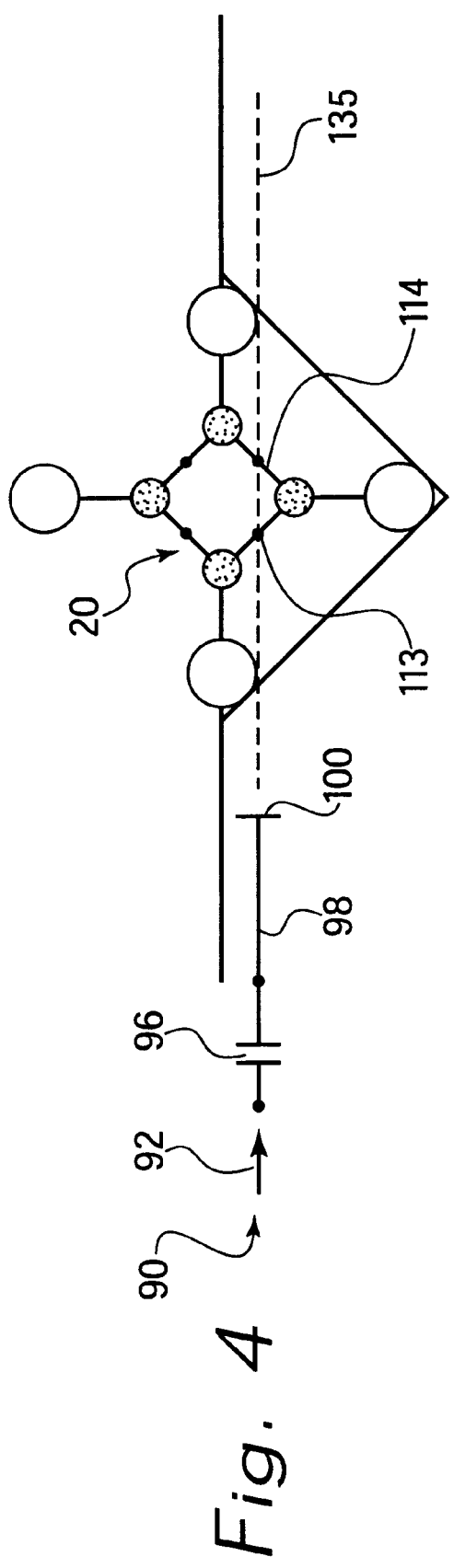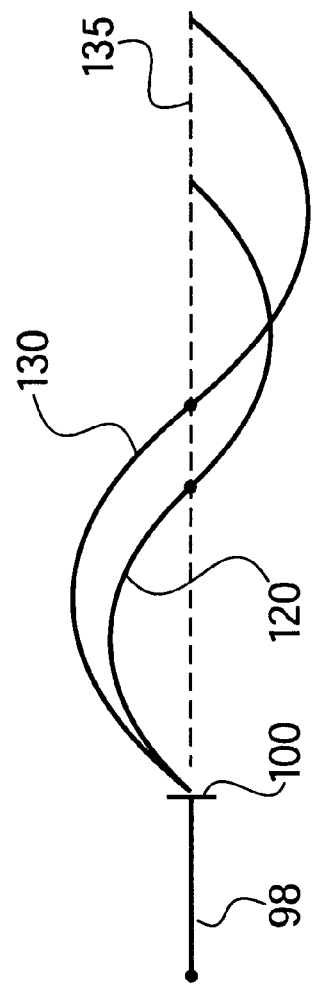

P-TYPE SILICON MACROMOLECULE USED IN A TRANSISTOR AND PROCESS FOR MANUFACTURE OF THE MACROMOLECULE

BACKGROUND OF THE INVENTION

1. Field of the Invention

The present invention relates to a P-type silicon macromolecule that is doped. The macromolecule can form a base layer in a transistor having an emitter layer and a collector layer.

The process for forming the invention includes the following steps: a) evaporation of a silicon crystal in a closed environment for producing a monatomic silicon vapor; b) generation of a rotating magnetic field enclosing the monatomic silicon vapor; c) injection of at least one doping material into the monatomic silicon vapor for producing a monomolecular silicon-doping material vapor; and d) cooling of the monomolecular silicon-doping material vapor to a temperature below the crystallization temperature. The invention also includes a device for manufacturing the transistor comprising: a heatable vacuum mist chamber for receiving silicon crystal; at least one doping material inlet located on the vacuum mist chamber; and a magnet enclosing the mist chamber wherein the magnet produces a rotating magnetic field.

2. The Prior Art

Such semiconductor devices are described in German patent applications DE 197 22 398.2, DE 197 34 267.1, DE 197 39 491.4 and DE 197 43 755.9.

Different electrical properties can be obtained in layers of the transistor through the creation of a deficit or excess of electrons during manufacture. The drawback of such a conventional bipolar transistor is that it can be acted upon by only one single control current at one time. For more complex circuits this means that a correspondingly large number of transistors is required.

The barrier layer of the transistor normally contains silicon or doped silicon as it is found in nature; i.e. in the pitchblende configuration. Unfortunately this pitchblende configuration can only handle one control current which, can trigger only one single function of the diode or transistor. Due to a direct galvanic connection with the environment, the barrier layer is dependent upon the application of a bias voltage to overcome the threshold voltage of 0.7 volts. This threshold voltage is set by the properties of the material. In addition, this transistor is connected with dissipation, which has to be drained off. Another drawback is that due to the direct galvanic connection of the barrier layer with the adjacent semiconductor layers, only currents with identical charge carrier substance can be transported.

SUMMARY OF THE INVENTION

An object of the present invention is to create a control input structure for activating the base of the transistor consisting of a p-type (p-doped) silicon macromolecule, that is simple in design, inexpensive to manufacture and reliable in use.

Another object of the present invention is to make a barrier layer for semiconductor devices which, with complete electrical separation is capable of processing a multitude of differentiated control currents for a correspondingly differentiated behavior of the semiconductor device without requiring a bias voltage.

The invention relates to a p-type silicon macromolecule, in which silicon atoms form the corners of multifaceted structure having sides. Attached to each silicon atom is a doping atom. The doping atoms radiate out from the center of the molecule to form an outer multifaceted structure having sides parallel to the inner multifaceted structure.

One application for the macromolecule is in a transistor that comprises an emitter layer, a collector layer, a base layer. The transistor base layer is comprised of the macromolecule. Connected to the transistor is a control input structure. The control input structure comprises a dipole connected to a boundary surface on the transistor and at least one external modulation capacitor connected to the dipole. The capacitor receives a carrier signal from a control input signal. The dipole is spaced from the center of a boundary surface by half a wavelength of the carrier signal. In this case, the charge carrier flows from the center of the affected surface on the emitter layer to the opposite parallel surface on the collector layer.

The macromolecular structure of the transistor relies on the premise that electron exchange takes place only between parallel surfaces. These parallel surfaces create quasi channels for transmitting the charge carrier. Therefore, to transmit different charge carriers, they can be transmitted by channels substantially perpendicular to these pairs of surfaces without influencing each other. When a transistor has such a structure, the quantity and quality of amplification effect is determined by the quantity and quality of the given input signal. Therefore, a mixture voltage at the transistor output represents a copy of the control voltage fed into the transistor.

Due to the design of the novel transistor, the invention has many advantages. First, the conventional bipolar transistor is dependent upon overcoming the threshold voltage predetermined by the material properties and the bias voltage. However, the transistor based upon the invention, does not require a bias current generated by the bias voltage. This is because there is a sufficient electrical field between the collector layer and the emitter layer due to the extremely low atomic density of the base material. This means that the transistor according to the invention does not require any current supply in the idle state, which in turn offers the advantage that electrical reactions can be triggered in the transistor exclusively by the input voltages applied. Since no bias current flows with a transistor having such a structure, no off-heat is generated that would have to be dissipated through suitable measures. In addition, this type transistor also has an extremely high electrical noise spacing.

Another advantage of this invention is that the transistor having the macromolecular base can be operated both with very low and very high voltages. In detail, such a transistor can be operated with low voltages because the small atomic substance of the base macromolecule ensues high electrical sensitivity of the overall system. High voltages can be processed by this transistor because the geometric configuration of the base molecule transmits the electron currents distributed over wide spaces.

In addition, another advantage of the invention is that the transistor with the macromolecular barrier layer has complete electrical separation of the barrier layer from the adjacent layer or layers of the semiconductor device. In this case, the transistor forms an electrical separation element in a circuit. This same result also applies to a diode. The electrical separation allows quantitatively identical but new charge carriers to be available at the output of the semiconductor device based upon the input in the device.

The macromolecule can be formed by a process involving the following steps: a) evaporation of a silicon crystal in a closed environment for producing a monatomic silicon vapor; b) generation of a rotating magnetic field enclosing the monatomic silicon vapor; c) injection of at least one doping material into the monatomic silicon vapor for producing a monomolecular silicon-doping material vapor; and d) cooling of the monomolecular silicon-doping material vapor to a temperature below the crystallization temperature.

The invention also includes a device for manufacturing the macromolecule comprising: a heatable vacuum mist chamber for receiving silicon crystal; at least one doping material inlet located on the vacuum mist chamber; and a magnet enclosing the mist chamber wherein the magnet produces a rotating magnetic field.

BRIEF DESCRIPTION OF THE DRAWINGS

Other objects and features of the present invention will become apparent from the following detailed description considered in connecting with the accompanying drawings, which disclose several embodiments of the present invention. It should be understood, however, that the drawings are designed for the purpose of illustration only and not as a definition of the limits of the invention.

In the drawings, wherein similar reference characters denote similar elements throughout the several views:

FIG. 4 is a schematic representation of the transistor in combination with a control input device;

FIG. 5 is the direction of propagation of signal wave trains;

DETAILED DESCRIPTION OF THE PREFERRED EMBODIMENT

Figure 1:
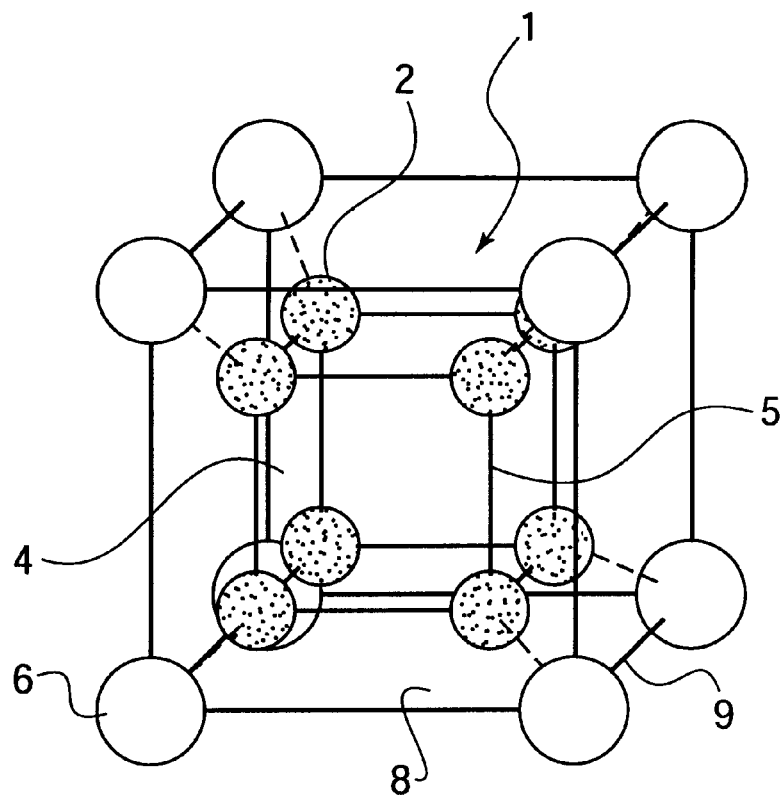
FIG. 1 is a three dimensional view of the macromolecule according to the invention.

FIG. 1 is a three-dimensional view of macromolecule 1 with the structure of a hexahedron. Silicon atoms 2 are shown by black filled circles or balls which form an inner cube 4 having sides 5. The doping material atoms 6 are shown by unfilled circles or balls and form an outer cube 8 having sides 9.

Figure 2:
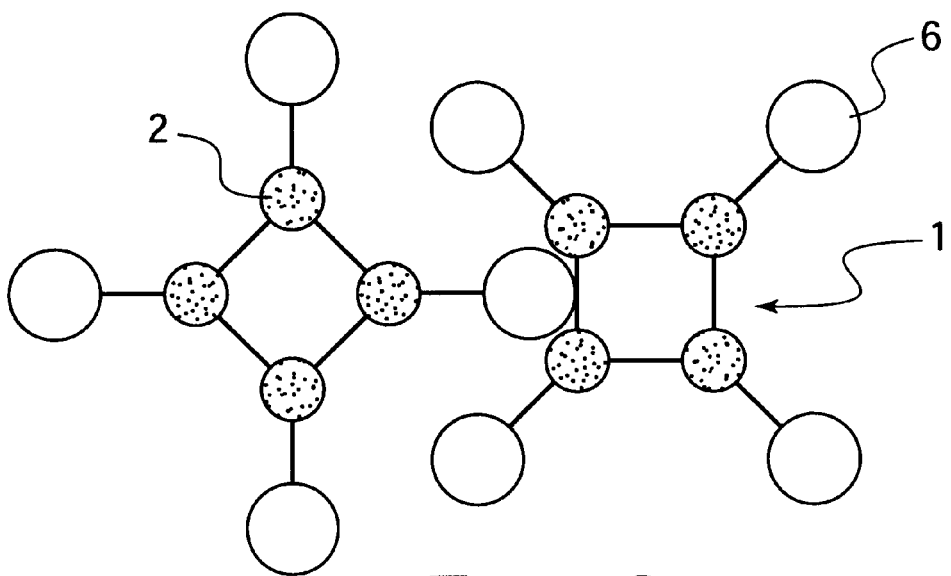
FIG. 2 is a three dimensional view of the macromolecule in combination with an additional macromolecule.

As shown in FIGS. 1 and 2, the silicon atoms of the p-type silicon macromolecule 1 are disposed in the corner positions on inner cube 4. Inner cube 4 represents the bonding cube for the silicon atoms. Inner cube 4 is surrounded by an outer doping material cube 8 with sides 9 parallel to sides 5 on inner cube 4.

Because the doped silicon cube still contains silicon atoms with a bonding tendency, the silicon cube still has a bonding tendency towards adjacent silicon cubes. Since these silicon atoms still contain this latent bonding tendency, the silicon atoms are aligned in such a way that their doping material atoms align themselves in the surface centers of an adjacent inner silicon cube. (see FIG. 2). As shown in FIG. 2, when the doping material atoms come to rest on the surface centers of cube 4 the doping atoms 6 serve as electrically effective spacers, which prevent any direct bonding electron exchange between silicon atoms 2 on adjacent cubes 4. Therefore, the electron transport takes place via field transport.

Figure 3:
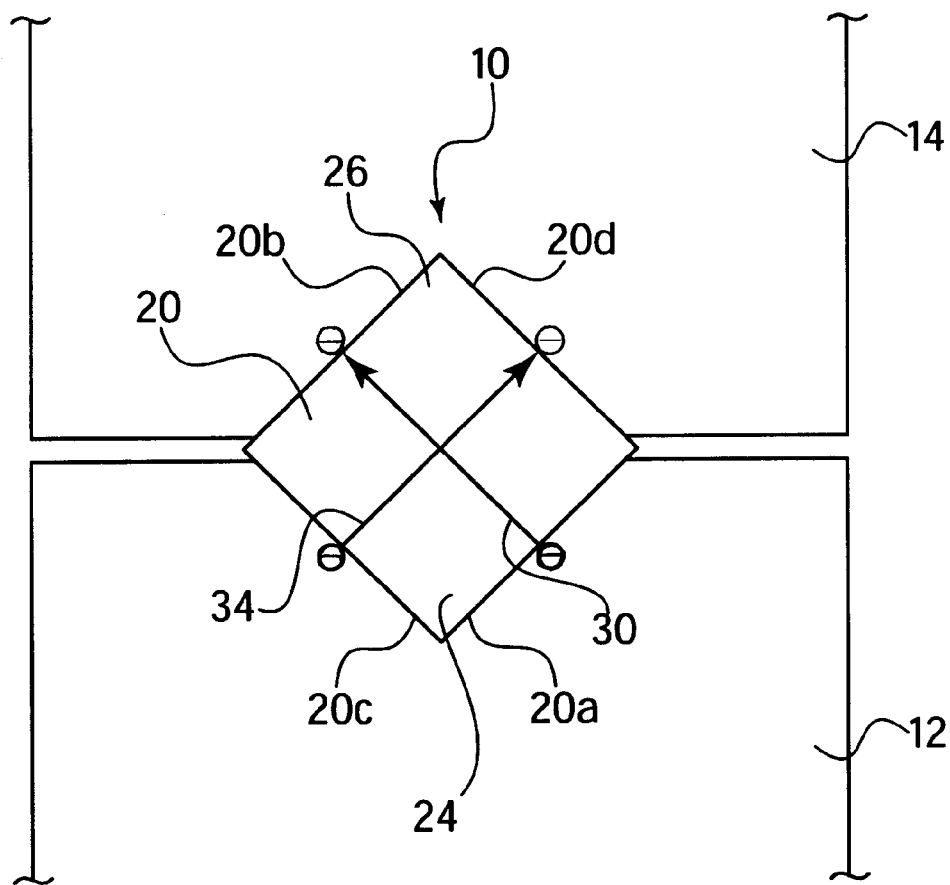
FIG. 3 is a schematic representation of a transistor formed with the macromolecule.

FIG. 3 shows the transistor 10 which consists of an emitter layer 12, a collector layer 14 and base layer 20. As opposed to the conventional bipolar transistor, base 20 is shaped in the form of an unstructured layer of macromolecule 1, which is disposed between emitter layer 12 and the collector layer 14.

Base 20 comprises only one single elementary cell of macromolecule 1 which is schematically shown in FIG. 3.

FIG. 3 shows an example of a cube of hexahedron, which is projected into a flat square (two dimensional) representation. Base layer 20 is dissected into two triangular halves 24 and 26. The first half 24 projects onto emitter layer 12, and second half 26 projects onto collector layer 14. This means that one edge 20a is located on emitter layer 12 and a parallel edge 20b is located on collector layer 14. Similarly another edge 20c is disposed on emitter layer 12 and an opposite edge 20d is disposed on collector layer 14.

The transistor operates as follows: a control voltage is applied to a control input, wherein such a voltage acts on the surface of the cube or square edge 20c. This voltage leads to a transport of charge carrier, from edge 20c to edge 20d as schematically shown by arrow 30. The normal transitorial effect takes place between the two layers, which are schematically illustrated by edges 20c, and 20d. A control voltage acts on edge 20a in a similar way so that it transports a charge carrier from edge 20a to edge 20b as shown by arrow 34. This movement of a charge carrier across the transistor allows a dc supply voltage to flow between emitter layer 12 and collector layer 14.

The transistor is not limited to simply a macromolecular structure with a cube as an elementary cell. It is also possible to use any multi-faceted element having at least four surfaces such as: a dodecahedron, or a hexahedral structure. For example the dodecahedron can have two surfaces opposing each other with a spacing for a transport charge carrier.

FIGS. 4 and 5 show one application of the invention in its operation. For example, FIG. 4 shows the two-dimensional projection of the macromolecule 1 of FIGS. 1 and 2 embedded in emitter layer of the transistor shown in FIG. 3. However in this embodiment, a control input 90 is attached to base layer 20. Control input 90 contains a control signal 92 which is fed into modulation capacitor 96. The control signal next flows from modulation capacitor 96 through line 98 and into dipole 100. If the control input 90 is to control more than one channel, then the control input structure is supplemented by a corresponding number of modulation capacitors, which are connected in parallel to dipole 100 via line 98. Line 98 also feeds the control signal into macromolecule base 20.

Control input 90 serves to feed the control signal into macromolecule 15 and for transmitting charge carriers between parallel surfaces 20a, 20b, 20c, and 20d as shown in FIG. 3.

The transmission of the control signal is created by the control input signal as it passes through modulation capacitor 96. The frequency of the carrier signal after it passes the modulation capacitor is dimensioned so that the carrier half cycle corresponds with the spacing between dipole 100 and one single surface center 113 or 114 of base 20. While the control input 90 is shown connecting to surface center 113 an additional control input is connected to surface center 114 but is not shown.

FIG. 5 shows the direction of propagation of the corresponding signal wave trains 120, and 130 which is shown by broken line 135. The purpose of the carrier signal or carrier wave is to supply surface centers 113 and 114 with the useful control input signal and to allocate to the signal the direction of passage. In another way, the carrier signal serves as a gate for the associated useful control input signal.

The frequency of the carrier signal or carrier wave usually exceeds the frequency of the associated control input signal by several decimal exponents. In the case of a low-frequency signal, the frequency of the carrier signal is in the gigahertz range. Because the carrier signal is in this range, the auxiliary signal is not relevant to assist in further processing of a low-frequency signal. Basically the carrier signal can be separated from the useful signal later, after leaving the transistor, by means of an inverse process as employed with the modulation of the carrier signal upon the control input signal at the input of the transistor.

Once macromolecule 1 is formed, it can be used in many different applications. For example, macromolecule 1 can serve as a p-type silicon macromolecule which is an electron-deficient control element of a semiconductor device. In addition, macromolecule 1 can serve as a p-type silicon macromolecule in a barrier layer crystal of an np-diode. Finally, silicon macromolecule 1 can serve as a base barrier crystal of an npn-type transistor.

Figure 6:
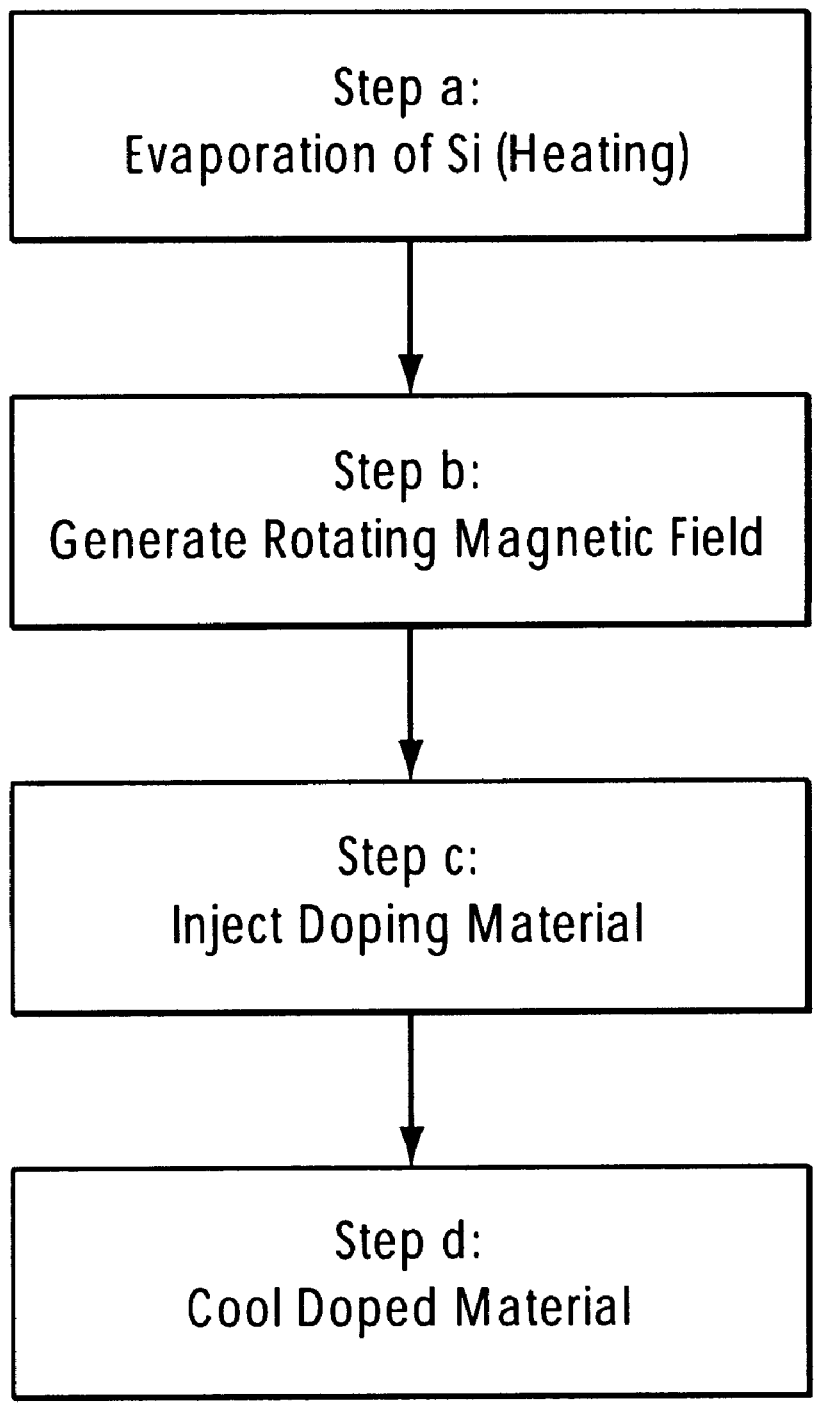
FIG. 6 is a flow chart of the process for forming the invention.

FIG. 6 shows the process for producing the invention which starts with step A which is the generation of monatomic silicon vapor. The vapor is supplied with a feed heat to prevent spontaneous recrystallization and also to promote bonding with doping materials provided in the form of vapor.

In step b, a magnetic field is applied to the vaporized silicon atoms. Next, in step c, vaporized doping material is injected into the mixture.

When the silicon atoms bond with the doping material atoms, the bonding atoms exchange pairs. This reaction leads to the displacement of the charge carrier which leads to an electrical reaction in a magnetic field applied from the outside. Such a reaction of motion can be translated by rotation of the external magnetic field into a circular path whose rotation frequency is dependant upon the rotation frequency of the external magnetic field. In this way, all of the molecules are arranged in a narrowly defined circular path in such a way that the heavy atoms of the doping material point outwardly forming an outer cube, and the light silicon atoms remain on an inner path forming the inner cube. While the atoms of the doping material circulating along the outer path are in a state of bonding saturation, the silicon atoms circulating along the inner path retain their potential for bonding.

In step D, the vapor atoms are crystallized. In this step, the silicon atoms enter into a mutual bond by employing the two remaining bonding electrons not bound with the doping atoms. In this way a macromolecule with an inner silicon lattice and an outer doping-material structure is obtained.

These macromolecules can be assembled to form a larger composite macromolecule structure. The silicon atoms in each lattice have a natural bonding tendency towards each other. However, the bonding tendency is impaired by the outer doping material atoms acting as spacers. These spacers prohibit an electrical connection between the inner silicon lattice structures.

To provide at least one doping material atom for each silicon atom, the process is controlled so that the injection of the doping material takes place spontaneously or with a time duration approaching zero. In addition, the cooling step is delayed by a predetermined time interval to assure that all doping-material molecules have assumed a configuration position in both orbits that is ideal for spontaneous crystallization.

Any type doping material is suitable for the process as defined above. If aluminum is used as the doping material, the process leads to the structure of a dodecahedron if the temperature of the monatomic silicon vapors is between 110 C and 240 C and the frequency of the magnetic field is between 500 Hz and 50 kHz.

Figure 7:
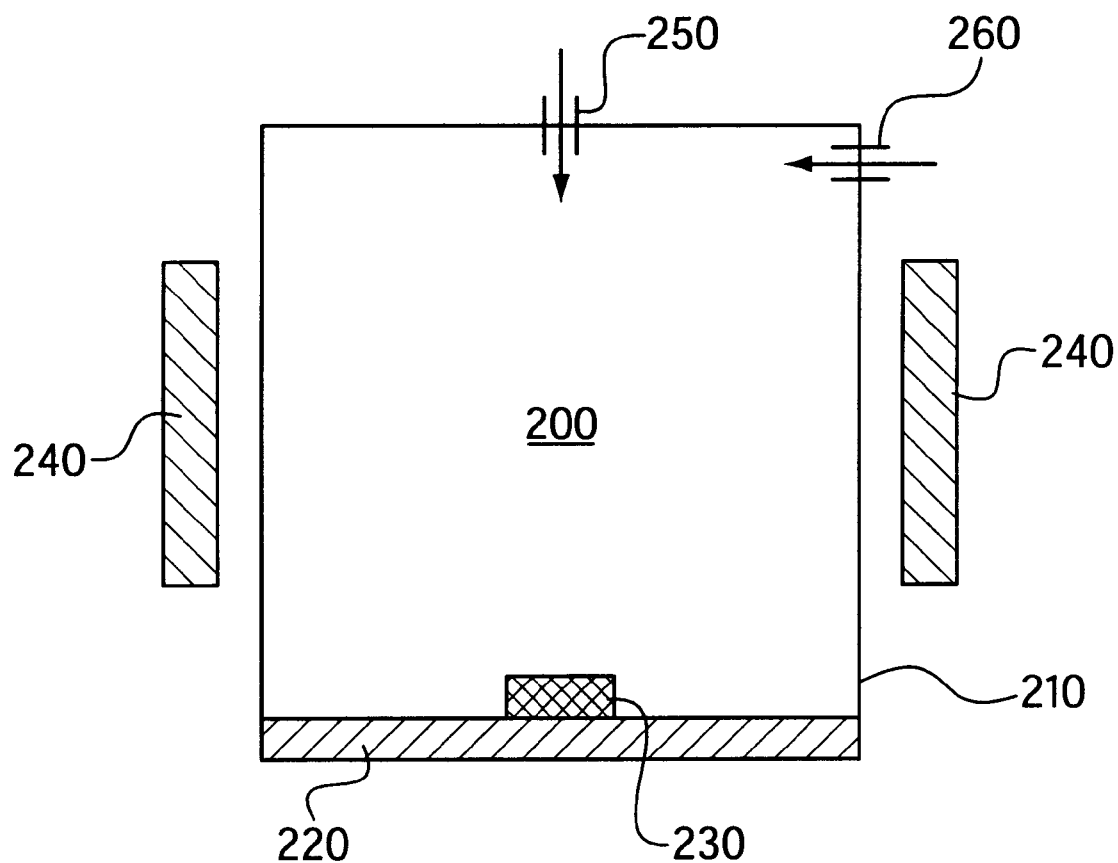
FIG. 7 is a schematic cross-section representation of the device for manufacturing the invention.

FIG. 7 shows the device 200 for creating the macromolecule. Device 200 has a vacuum mist or deposition chamber 210 which, may have the shape of a broad stone. However, any other shape is also possible such as a spherical shape. Mist chamber 210 can be heated on the bottom side by a heating device 220. Heating device 220 is arranged on the outer side of the bottom of mist chamber 210 with device 220 being in direct contact with the bottom of chamber 210. In addition, a silicon crystal 230 is placed on the bottom of mist chamber 210. Silicon crystal 230 is evaporated by feeding heat onto the bottom of chamber 210.

Vacuum mist chamber 210 is surrounded by a ring-shaped electromagnet 240 which has a longitudinal center axis that coincides with the vertical longitudinal center axis of mist chamber 210. In addition, an inlet 250 is positioned on top of chamber 210. The inlet 250 has a valve (not shown) for admitting doping material vapor into vacuum mist chamber 210. Another inlet 260 serves for feeding coolant into the interior of mist chamber 210.

While several embodiments of the present invention have been described, it is to be understood that many changes and modifications may be made thereunto without departing from the spirit and scope of the invention as defined in the appended claims.

What is claimed is:

1. A process for producing a silicon macromolecule comprising the following steps:

a) evaporating a silicon crystal in a closed environment for producing a monotomic silicon vapor;

b) generating a rotating magnetic field enclosing the monatomic silicon vapor;

c) injecting at least one doping material into the monatomic silicon vapor for producing a monomolecular silicon doping material vapor; and d) cooling the monomolecular silicon-doping material vapor to a temperature below the crystallization temperature to produce a p-type silicon macromolecule that is a solid body independent of any substrate.

2. The process according to claim 1, wherein said step of injecting the doping material vapor takes place spontaneously or with a time duration approaching zero in order to simultaneously supply one doping material atom to each silicon atom.

3. The process according to claim 1, wherein said step of cooling the macromolecule is delayed by a time interval to assure that all doping material atoms have assumed a configuration position to maximize spontaneous crystallization.

4. The process according to claim 1, wherein heat is admitted in order to maintain the monatomic state of the silicon vapor in steps a, b, and c.

5. The process according to claim 1, wherein the magnetic field is an electromagnetic field.

6. The process according to claim 1, wherein the doping material is aluminum.

7. The process according to claim 1, wherein the temperature of the monatomic silicon vapor is between 110 and 240 C.

8. The process according to claim 7, wherein the temperature of the monatomic silicon vapor is between 175 and 190 C.

9. The process according to claim 7, wherein the temperature of the monatomic silicon vapor is approximately 184 C.

10. The process according to claim 1, wherein the rotation frequency of the magnetic field is between 500 Hz and 50 kHz.

11. The process according to claim 10, wherein the rotation frequency of the magnetic field is between 9 kHz and 16 KHz.

12. The process according to claim 10, wherein the rotation frequency of the magnetic field is about 12 KHz.

* * * * *